(12) United States Patent
Hartner et al.

(10) Patent No.: US 6,503,792 B2
(45) Date of Patent: Jan. 7, 2003

(54) METHOD FOR FABRICATING A PATTERNED METAL-OXIDE-CONTAINING LAYER

(75) Inventors: Walter Hartner; Günther Schindler; Volker Weinrich, all of München (DE); Mattias Ahlstedt, Delft (NL)

(73) Assignee: Infincon Technologies AG, Munich (DE)

( * ) Notice: Subject to any disclaimer, the term of this patent is extended or adjusted under 35 U.S.C. 154(b) by 0 days.

(21) Appl. No.: 09/750,531

(22) Filed: Dec. 28, 2000

(65) Prior Publication Data

US 2001/0044160 A1 Nov. 22, 2001

(Under 37 CFR 1.47)

(30) Foreign Application Priority Data

Dec. 28, 1999 (DE) .......................................... 199 63 500

(51) Int. Cl.$^7$ .......................................... H01L 21/8242
(52) U.S. Cl. .......................... 438/240; 438/3; 438/253
(58) Field of Search .............................. 438/3, 238–240, 438/250–256, 381, 393–399

(56) References Cited

U.S. PATENT DOCUMENTS

| | | | |
|---|---|---|---|
| 5,434,102 A | 7/1995 | Watanabe et al. | |
| 5,612,082 A | 3/1997 | Azuma et al. | |
| 5,719,416 A | 2/1998 | Yoshimori et al. | |
| 5,814,849 A | 9/1998 | Azuma et al. | |
| 6,309,894 B1 * | 10/2001 | Miki et al. | 438/240 |

FOREIGN PATENT DOCUMENTS

| | | |
|---|---|---|
| DE | 198 51 280 A1 | 5/2000 |
| GB | 1 210 677 | 10/1970 |

OTHER PUBLICATIONS

Kinam Kim: "Technology Perspective for 1T/1C FRAM", Integrated Ferroelectrics, 1999, vol. 25, pp. 149–167.

D.E. Kotecki et al.: "(Ba,Sr)TiO$_3$ dielectrics for future stacked–capaciator DRAM", IBM J. Res. Develop., vol. 43, No. 3, May 1999, pp. 367–382.

Jae–Hyun Joo et al.: "Improvement of leakage currents of Pt/(Ba,Sr)TiO$_3$/PT capacitors", Appl. Phys. Lett. vol. 70, No. 22, Jun. 2, 1997, pp. 3053–3055.

W. Hönlein: "Neue Dielektika für Gbit–Speicherchips", [new dielectrics for Gbit memory chips], Phys. Bl., vol. 55, 1999, No. 2, pp. 51–53.

K.P. Lee et al.: "Dry Etching of BaSrTiO$_3$ and LaNiO$_3$ Thin Films in inductively Coupled Plasmas", Journal of the Electrochemical Society, vol. 146, No. 10, 1999, pp. 3778–3782.

P.C. Joshi et al.: "Influence of postdeposition annealing on the enhanced structural and electrical properties of amorphous and crystalline Ta$_2$O$_5$ thin films for dynamic random access memory applications", Journal of Applied Physics, vol. 86, No. 2, Jul. 15, 1999, pp. 871–880.

* cited by examiner

*Primary Examiner*—Jey Tsai
(74) *Attorney, Agent, or Firm*—Laurence A. Greenberg; Werner H. Stemer; Ralph E. Locher

(57) ABSTRACT

The damage to edge sections which occurs during the patterning of a metal-oxide-containing layer can be compensated by the deposition of an annealing layer and a subsequent heat treatment step through which a material flow takes place from the annealing layer into the damaged edge sections. The metal-oxide-containing layer can form the dielectric of a storage capacitor of a DRAM memory cell.

14 Claims, 2 Drawing Sheets

METHOD FOR FABRICATING A PATTERNED METAL-OXIDE-CONTAINING LAYER

BACKGROUND OF THE INVENTION

Field of the Invention

The invention relates to a method for fabricating a patterned metal-oxide-containing layer. In particular, the invention relates to the fabrication of a patterned metal-oxide-containing layer which is used as a ferroelectric or paraelectric dielectric in a storage capacitor of a DRAM memory cell.

The dynamic semiconductor memory components (DRAMs) which are fabricated in microelectronics essentially comprise a selection or switching transistor and a storage capacitor in which a dielectric material is inserted between two capacitor plates. Usually, oxide or nitride layers having a dielectric constant of at most about 8 are mainly used as the dielectric. In order to reduce the size of the storage capacitor and to fabricate nonvolatile memories, "novel" capacitor materials such as, for example, ferroelectric or paraelectric materials with significantly higher dielectric constants are required. Some of these materials are mentioned in the publication "Neue Dielektrika für Gbit-Speicherchips" [New Dielectrics for Gbit Memory Chips] by W. Hönlein, Phys. Bl. 55 (1999). In order to fabricate ferroelectric capacitors for applications in such nonvolatile semiconductor memory components having a high integration level, e.g. ferroelectric materials such as $SrBi_2(Ta, Nb)_2O_9$ (SBT or SBTN), $Pb(Zr, Ti)O_3$ (PZT), or $Bi_4Ti_3O_{12}$ (BTO) can be used as the dielectric between the capacitor plates. However, it is also possible to use a paraelectric material such as, for example, $(BaSr)TiO_3$ (BST).

The use of these novel ferroelectric or paraelectric dielectrics presents new challenges to semiconductor process technology. This is because, firstly, these novel materials can no longer be combined with polysilicon, the traditional electrode material. Therefore, it is necessary to use inert electrode materials such as, for example, platinum-group metals, i.e. Pt, Pd, Ir, Rh, Ru or Os, or their conductive oxides (e.g. $RuO_2$). It is also possible generally to use conductive oxides such as $LaSrCoO_x$ or $SrRuO_3$. The reason for this is that after the deposition of the ferroelectric dielectric, the latter has to be thermally treated ("conditioned") if appropriate a number of times in an oxygen-containing atmosphere at temperatures of about 550–800° C. In order to avoid undesirable chemical reactions between the ferroelectric dielectric and the electrodes, the latter are therefore mainly produced from platinum or another sufficiently thermostable and inert material, such as another platinum-group metal or a conductive oxide.

During the fabrication of the storage capacitor, patterning steps are necessary in which the ferroelectric layer is partly removed by an etching step. In this case, it has been shown that the remaining edge regions of the ferroelectric layer are damaged in a certain way. In particular, it has been shown that the stoichiometric composition of SBT layers in the edge sections deviates from the original stoichiometric composition and has a deficiency of bismuth. SAMSUNG has disclosed a wet-chemical method in which the damaged regions around the storage capacitor produced from PZT material are removed after the etching step. However, this leads to an undesirable loss of layer material of the ferroelectric layer and thus to a loss of storage capacitance of the storage capacitor to be fabricated.

SUMMARY OF THE INVENTION

It is accordingly an object of the invention to provide a method of fabricating a patterned, metal-oxide-containing layer which overcomes the above-mentioned disadvantages of the heretofore-known devices and methods of this general type and in which damage to the metal-oxide-containing layer that has occurred during the patterning can be compensated without a loss of material.

With the foregoing and other objects in view there is provided, in accordance with the invention, a method of fabricating a patterned metal-oxide-containing layer. The method comprises the following method steps:

providing a substrate;

depositing a metal-oxide-containing layer on the substrate;

patterning the metal-oxide-containing layer and thereby causing edge sections of the metal-oxide-containing layer to have a stoichiometric deficiency of a given element in the metal-oxide-containing layer;

applying an annealing layer to cover the metal-oxide-containing layer at least on the edge sections, the annealing layer containing the given element of the metal-oxide-containing layer; and heat-treating to diffuse the given element from the annealing layer into regions of the edge sections of the metal-oxide-containing layer having the stoichiometric deficiency.

In other words, a metal-oxide-containing layer is applied to the substrate; the metal-oxide-containing layer is patterned; an annealing layer is deposited, which covers the metal-oxide-containing layer at least on edge sections and which contains at least one element which is also contained in the metal-oxide-containing layer but, on account of the patterning, has a deficiency in the stoichiometric composition in the edge sections; and the assembly is subjected to a heat treatment in such a way that the element diffuses from the annealing layer into damaged regions of the edge sections of the metal-oxide-containing layer.

The method according to the invention can be carried out on a free-standing metal-oxide-containing layer, the annealing layer covering the metal-oxide-containing layer preferably completely, and thus in any case lying on the edge sections. However, it is also possible for a further layer to have been applied to the metal-oxide-containing layer before patterning and for both layers to have been patterned together, the annealing layer subsequently being applied to the further layer and the metal-oxide-containing layer in such a way that the annealing layer covers at least one lateral edge section of the metal-oxide-containing layer. In this case, the metal-oxide-containing layer may form the dielectric of a storage capacitor, the further layer may form the top electrode of the storage capacitor, and the substrate may be formed by the bottom electrode of the storage capacitor.

Afterwards, the annealing layer may be removed from the metal-oxide-containing layer and, if appropriate, the further layer. However, it may also be left on the metal-oxide-containing layer and, if appropriate, the further layer, in which case, however, it may be necessary to etch contact holes through the annealing layer for the purpose of making contact with the further layer. Particularly if the further layer is intended to serve as the top electrode of a storage capacitor, it may become necessary to form a contact hole through the annealing layer.

In accordance with an added feature of the invention, the heat treatment step is preferably performed in a temperature range of 500–800° C., for a period of 5 to 30 min, and in an $O_2$ or $N_2$ atmosphere.

Preferably for the purpose of fabricating a storage capacitor for a DRAM memory cell, the metal-oxide-containing layer is formed by a ferroelectric or a paraelectric material. In the first-mentioned case, the metal-oxide-containing layer preferably contains one of the materials $SrBi_2(Ta, Nb)_2O_9$ (SBT or SBTN), $Pb(Zr, Ti)O_3$ (PZT) or $Bi_4Ti_3O_{12}$ (BTO). In the second-mentioned case, the metal-oxide-containing layer contains the material $(BaSr) TiO_3$ (BST), for example. the metal-oxide-containing layer is formed by the material then the annealing layer may contain for example one or of the following materials: SBT, $BiO_x$/SBT, SBT+$BiO_x$, $TiO_x$, $BiTiO_x$/SBT, SBT/$BiTiO_x$ or $BiO_x$.

The metal-oxide-containing layer and/or the annealing layer may be deposited by means of metal organic deposition (MOD), metal organic vapor-phase deposition (MOCVD) or by a puttering process.

For the case of fabricating a storage capacitor, a platinum-group metal or a conductive oxide of a platinum-group metal may be used as electrode material.

With the above and other objects in view there is also provided, in accordance with the invention, a method of fabricating a semiconductor component, such as a DRAM memory cell, which comprises:

forming a switching transistor on a semiconductor substrate;

depositing a first insulation layer on the switching transistor; and forming a storage capacitor on the insulation layer, and thereby fabricating a dielectric of the storage capacitor by applying and patterning a metal-oxide-containing layer according to the above-outlined steps.

Other features which are considered as characteristic for the invention are set forth in the appended claims.

Although the invention is illustrated and described herein as embodied in a method for fabricating a patterned metal-oxide-containing layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In the design of a DRAM memory cell there are essentially two different structural concepts which are both. distinguished by the fact that the switching transistor is formed in a lower plane directly on the semiconductor substrate and the storage capacitor is arranged in an upper plane, both being isolated from one another by an intervening insulation layer.

In the first structural concept ("stacked cell"), the switching transistor and the storage capacitor are essentially arranged directly above one another, the bottom electrode of the storage capacitor and the drain region of the MOS transistor being electrically connected to one another by a contact hole ("plug") through the insulation layer. The contact hole is filled with a conductive material.

In the second structural concept ("offset cell"), the switching transistor and the storage capacitor are arranged offset from one another, the top electrode of the storage capacitor being electrically connected to the drain region of the MOS transistor through two contact holes.

Figure 1:
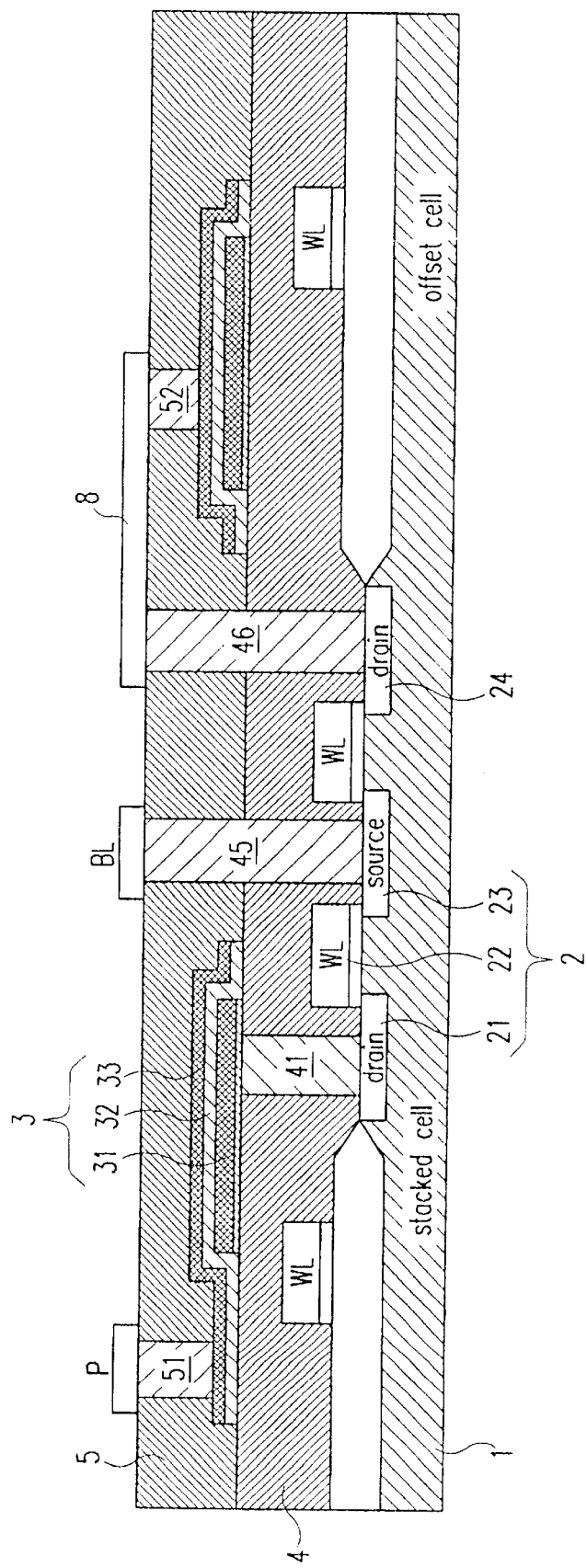
FIG. 1 is a cross-sectional view of a conventional DRAM memory cell in two different memory concepts.

Referring now to the figures of the drawing in detail and first, particularly, to FIG. 1 thereof, both structural concepts of a conventional DRAM memory cell are shown combined in a single component merely in order to simplify the illustration. The component structure is explained in more detail below with reference to the "stacked cell."

To begin with, a MOS transistor 2 is fabricated on a semiconductor substrate 1 as follows: doping is carried out to form a drain region 21 and a source region 23, between which there is a channel whose conductivity can be controlled by a gate 22 arranged above the channel. The gate 22 may be formed by, or connected to, a word line WL of the memory component.

The source region 23 is connected to a bit line BL of the memory component. The MOS transistor 2 is subsequently covered with a planarizing insulation layer 4, for example with an oxide such as $SiO_2$. A storage capacitor 3 is formed on this insulation layer 4 as follows: firstly a bottom electrode 31 is applied and patterned. The bottom electrode 31 is electrically connected to the drain region 21 of the MOS transistor 2 through a contact hole 41 filled with a conductive material, such as polycrystalline silicon. The structure that has been fabricated up to this point constitutes the substrate in the sense of the present invention.

A metal-oxide-containing layer 32 of a ferroelectric or paraelectric material, which forms the capacitor dielectric, is then deposited onto said substrate, i.e. onto the bottom electrode 31. The layer 32 extends beyond the bottom electrode 31 in the lateral direction and a top electrode 33 is deposited over its whole area and patterned. The resulting structure is finally covered once more by a second planarizing insulation layer 5, for example an oxide layer such as $SiO_2$. A further contact hole 51 is formed in the layer 5, through which the top electrode 33 of the storage capacitor 3 can be connected to an external electrical connection P (common capacitor plate) by means of a suitable conductive material. The source region 23 of the MOS transistor 2 is connected to the bit line BL as follows: a contact hole 45 extending through both insulation layers 4 and 5 is formed and filled with a conductive material, such as polycrystalline silicon.

The "offset cell" structure is fabricated in a similar manner. A contact hole 46 extending through both insulation layers 4 and 5 is formed, and the drain region 24 of the MOS transistor is connected to the top electrode of the storage capacitor by means of a conductive cross-connection 8 and a further contact hole 52 extending through the insulation layer 5.

In both memory variants, then, it is necessary to pattern the metal-oxide-containing layer 32. In order to compensate for the damage that occurs during the patterning in the process, the method according to the invention is carried out, which is explained below with reference to FIGS. 2A–2C.

Figure 2A:
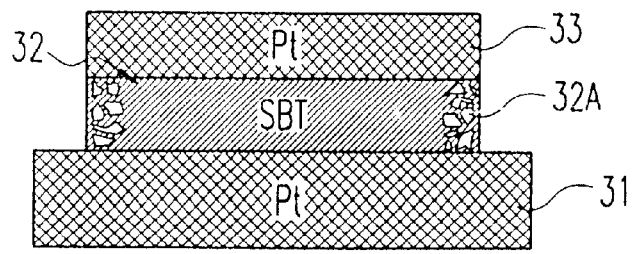
FIGS. 2A–2C are cross-sectional views of a storage capacitor fabricated according to the invention after individual method steps in accordance with an exemplary embodiment of the present invention.

A metal-oxide-containing layer 32, in the present case an SBT layer, is deposited onto a bottom electrode 31 made of platinum. This deposition may be effected optionally by an MOD (metal organic deposition) method or an MOCVD (metal organic chemical vapor deposition) method. The SBT material of the 910 layer 32 is present in an amorphous or polycrystalline state after deposition. A top electrode 33 made of platinum is subsequently deposited on the SBT layer, whereupon both layers 32 and 33 are patterned to a common form and size by conventional photolithography and etching technology. The end state of these method steps is illustrated in FIG. 2A. On account of the etching step, the SBT layer has structural damage in its edge sections 32A. In particular, it is found that the bismuth proportion is reduced in these edge sections 32A after the etching operation. This is mainly accompanied by a deterioration in the electrical properties of the layer 32 and a reduced storage capacitance of the storage capacitor 3.

Figure 2B:
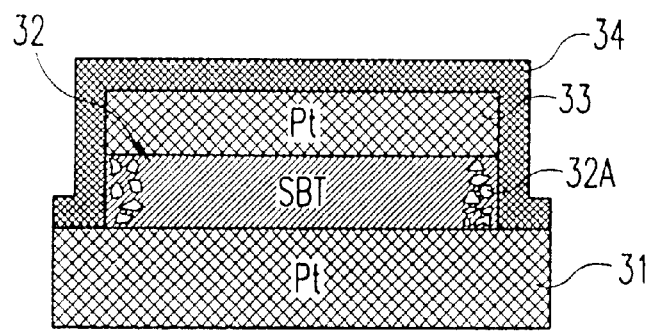
Figure 2C:
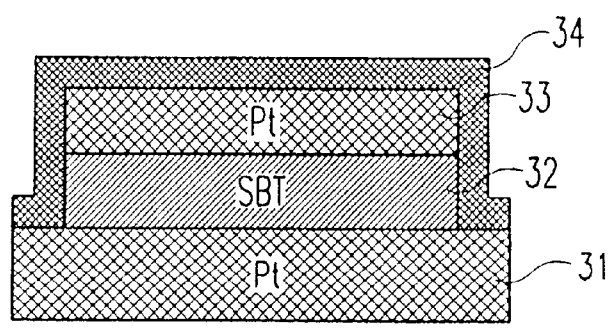

In a subsequent method step as shown in FIG. 2B, a bismuth-containing annealing layer 34 is applied to the structure. The material of the annealing layer 34 may contain one or more of the following materials: SBT, $BiO_x$/SBT, SBT+$BiO_x$, $BiTiO_x$, $BiTiO_x$/SBT, SBT/$BiTiO_x$. When these materials are used, removal of the annealing layer 34 after the method has been carried out is not possible, or is possible only with difficulty. For later contact-connection of the top electrode 34, therefore, it is necessary to etch a contact opening through the annealing layer 34. As an alternative, however, a pure bismuth oxide layer, for example, may also be deposited on the structure. This material has the advantage that it is volatile at high temperature and, accordingly, can be removed again from the structure relatively simply after the process has been carried out, so that subsequent contact-connection of the top electrode 33 is facilitated.

A heat treatment step is subsequently performed with the aim that material transport of the element bismuth will take place from the annealing layer 34 into the damaged edge sections 32A of the layer 32 and, consequently, the edge sections 32A will be annealed. This heat treatment step may simultaneously serve for converting the amorphous or weakly polycrystalline layer 32 into a monocrystalline or large-grained polycrystalline layer. However, a first heat treatment step may also have been performed before the patterning in order to crystallize the deposited metal-oxide-containing layer 32.

The heat treatment preferably takes place in a temperature range of between 500 and 800° C., for a period of between 5 and 30 min, and optionally in an $O_2$ or $N_2$ atmosphere. When this heat treatment is performed, bismuth diffuses into the damaged zones and thus compensates for the bismuth deficiency prevailing there. Consequently, the stoichiometry of the damaged edge sections 32A is reestablished and the full value of the metal-oxide-containing layer 32 can be regained.

When bismuth oxide is used, its higher volatility means that a starting temperature of as low as 400° C. can be used.

The invention can also be extended to other ferroelectric materials if it is to be assumed that an element or a component which is the most easily volatile is preferably removed during the etching or patterning of the metal-oxide-containing layer. By way of example, the material PZT can also be used for the metal-oxide-containing layer 32. In this case, the volatile component is Pb, so that edge sections 32A of the layer 32 which have a deficiency of Pb are present after the patterning has been performed. In this case, for the annealing layer 34, a Pb-containing layer is deposited onto the structure. During a subsequent heat treatment step, the element Pb of the annealing layer diffuses into damaged regions, i.e. edge sections of the layer 32.

The present invention can be applied in just the same way to other ferroelectric or paraelectric materials, preferably with regard to the fabrication of storage capacitors for DRAMs.

We claim:

1. A method of fabricating a patterned metal-oxide-containing layer, which comprises the following method steps:

providing a substrate;

depositing a metal-oxide-containing layer on the substrate;

heat treating the metal-oxide-containing layer in a first heat treatment step;

patterning the metal-oxide-containing layer and thereby causing edge sections of the metal-oxide-containing layer to have a stoichiometric deficiency of a given element in the metal-oxide-containing layer;

applying an annealing layer to cover the metal-oxide-containing layer at least on the edge sections, the annealing layer containing the given element of the metal-oxide-containing layer;

in a second heat treatment step, heat-treating to diffuse the given element from the annealing layer into regions of the edge sections of the metal-oxide-containing layer having the stoichiometric deficiency; and removing the annealing layer from the metal-oxide-containing layer after the second heat treatment step.

2. The method according to claim 1, which comprises:

prior to the patterning step, applying a further layer to the metal-oxide-containing layer, and then patterning both layers together; and applying the annealing layer to the further layer and the metal-oxide-containing layer such that the annealing layer covers at least one lateral edge section of the metal-oxide-containing layer.

3. The method according to claim 2, wherein:

the metal-oxide-containing layer forms a dielectric of a storage capacitor;

the further layer forms a top electrode of the storage capacitor; and the substrate is formed by a bottom electrode of the storage capacitor.

4. The method according to claim 2, which comprises removing the annealing layer from the further layer after the second heat treatment step.

5. The method according to claim 1, which comprises forming the layers surrounding the metal-oxide-containing layer of a material selected from the group consisting of a platinum-group metal and a conductive oxide.

6. The method according to claim 1, wherein the second heat treatment step comprises heat-treating in a temperature range of 500 to 800° C. for a period of 5 to 30 min.

7. The method according to claim 6, wherein the second heat treatment step comprises heat-treating selectively in an $O_2$ or $N_2$ atmosphere.

8. The method according to claim 1, wherein the metal-oxide-containing layer contains $SrBi_2(Ta, Nb)_2O_9$ and the given element to be supplied from the annealing layer is bismuth.

9. The method according to claim 8, wherein the annealing layer contains one or more materials selected from the group consisting of SBT, $Bio_x$/SBT, SBT+$BiO_x$, $BiTiO_x$, $BiTiO_x$/SBT, SBT/$BiTiO_x$, and $BiO_x$.

10. The method according to claim 1, wherein the metal-oxide-containing layer contains $PbO_3$ and the given element to be supplied from the annealing layer is lead.

11. The method according to claim 1, which comprises depositing the metal-oxide-containing layer with a process selected from the group consisting of metal organic deposition, metal organic vapor-phase deposition, and sputtering.

12. The method according to claim 1, which comprises depositing the annealing layer with a process selected from the group consisting of metal organic deposition, metal organic vapor-phase deposition, and sputtering.

13. A method of fabricating a semiconductor component, which comprises:
   forming a switching transistor on a semiconductor substrate;
   depositing a first insulation layer on the switching transistor; and
   forming a storage capacitor on the insulation layer, and thereby fabricating a dielectric of the storage capacitor by applying and patterning a metal-oxide-containing layer according to claim 1.

14. A method of fabricating a DRAM memory cell, which comprises:
   forming a switching transistor on a semiconductor substrate;
   depositing a first insulation layer on the switching transistor; and
   forming a storage capacitor on the insulation layer, and thereby fabricating a dielectric of the storage capacitor by applying and patterning a metal-oxide-containing layer according to claim 1.

* * * * *